United States Patent
Kim

(10) Patent No.: US 7,015,973 B2
(45) Date of Patent: Mar. 21, 2006

(54) METHOD AND APPARATUS FOR GENERATING COAST SIGNAL FOR IMAGE PROCESSING

(75) Inventor: Hak-Jae Kim, Suwon-si (KR)

(73) Assignee: Samsung Electronics Co., LTD, Suwon-si (KR)

(*) Notice: Subject to any disclaimer, the term of this patent is extended or adjusted under 35 U.S.C. 154(b) by 681 days.

(21) Appl. No.: 10/253,660

(22) Filed: Sep. 25, 2002

(65) Prior Publication Data

US 2003/0063220 A1    Apr. 3, 2003

(30) Foreign Application Priority Data

Sep. 28, 2001  (KR)  .................  2001-60565

(51) Int. Cl.
*H04N 5/12* (2006.01)

(52) U.S. Cl. ......................... 348/536

(58) Field of Classification Search ........ 348/533–538, 348/542, 545, 547; 327/7, 263, 299; 331/14, 331/20, 25

See application file for complete search history.

(56) References Cited

U.S. PATENT DOCUMENTS

| | | | | |
|---|---|---|---|---|
| 4,253,116 A | * | 2/1981 | Rodgers, III | 348/545 |
| 4,809,068 A | * | 2/1989 | Nagai | 348/545 |
| 4,885,554 A | * | 12/1989 | Wimmer | 331/25 |
| 5,019,907 A | * | 5/1991 | Murakoshi et al. | 348/542 |
| 5,502,711 A | * | 3/1996 | Clark et al. | 369/59.17 |
| 5,543,743 A | * | 8/1996 | Cooper | 327/263 |
| 5,617,137 A | * | 4/1997 | Whitlow | 348/193 |
| 5,663,688 A | * | 9/1997 | Delmas et al. | 331/14 |
| 5,790,200 A | * | 8/1998 | Tsujimoto et al. | 348/545 |
| 5,874,846 A | * | 2/1999 | Lee | 327/299 |
| 5,990,656 A | * | 11/1999 | Kardash | 318/807 |
| 6,211,920 B1 | * | 4/2001 | Cirot et al. | 348/533 |
| 6,222,590 B1 | * | 4/2001 | Makino | 348/547 |

* cited by examiner

*Primary Examiner*—Paulos M. Natnael
(74) *Attorney, Agent, or Firm*—Robert E. Bushnell, Esq.

(57) ABSTRACT

A method and an apparatus for generating a coast signal for enabling or disabling a phase comparator in a phase-locked loop of image processing apparatus. The phase-locked loop generates a sampling clock signal, which is used to convert an analog image signal into a digital image signal in response to a composite sync signal including a vertical sync signal and a horizontal sync signal. An enabled coast signal is generated at period other than detected horizontal sync period to prevent the phase comparator from comparing the composite synce signal to a reference signal, and a disabled coast is generated at periods corresponding to the horizontal sync period to permit the phase comparator to compare the composite synce signal to the reference signal.

17 Claims, 5 Drawing Sheets

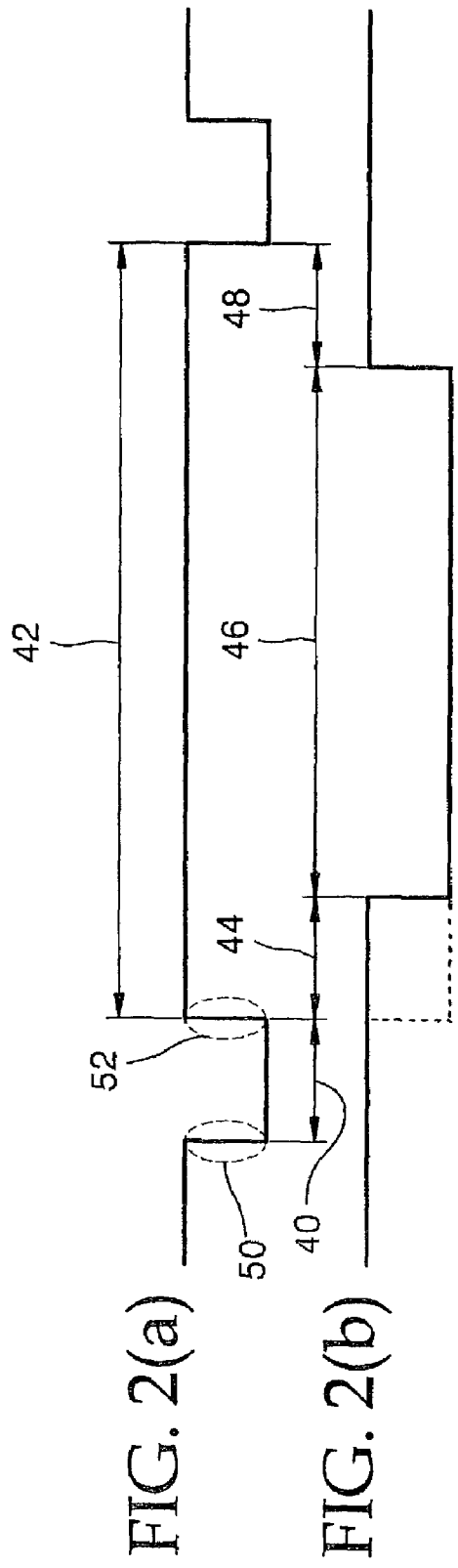

METHOD AND APPARATUS FOR GENERATING COAST SIGNAL FOR IMAGE PROCESSING

CLAIM OF PRIORITY

This application makes reference to, incorporates the same herein, and claims all benefits accruing under 35 U.S.C § 119 from an application entitled Method And Apparatus For Generating Coast Signal For Image Processing earlier filed in the Korean Industrial Property Office on Sep. 28 2001, and there duly assigned Ser. No. 2001-60565 by that Office.

BACKGROUND OF THE INVENTION

1. Field of the Invention

The present invention relates to an image signal processing, and more particularly, to an apparatus and a method for generating a coast signal necessary to controlling the generation of a sampling clock signal used to convert an analog image signal into a digital image signal.

2. Description of the Related Art

An image processing apparatus (not shown) that digitally processes an image signal includes an analog-to-digital converter (ADC) for converting an analog image signal into a digital image signal in response to a sampling clock signal; a phase locked loop (PLL) for generating the sampling clock signal in response to a sync signal; and a scaler for scaling the digital image signal received from the analog-to-digital converter so that the digital image signal can have a pre-defined resolution.

If the sync signal necessary when the phase locked loop generates the sampling clock signal includes a vertical sync signal, the phases of sampling clock signals may be different due to the following reasons.

For the horizontal sync (Hsync) signals and the vertical sync (Vsync)signals to have the same phase, the composite sync (Csync) signal has equalizing pulses around the vertical blanking interval, and serration pulses in the vertical blanking interval. The phases of the horizontal sync signal maybe different around or in the vertical blanking interval because of the vertical sync signal.

Therefore, if the ADC converts the analog image signal into the digital image signal using the sampling clock signal which is generated from an out of phase horizontal sync signal, a part of the display window may be skewed (bent) by the converted digital image signal.

To solve the above problem, it is known to control a phase comparator (detector) in the PLL using a coast signal, masking signal, inhibit signal or a vertical sync signal in order to generate the sampling clock signal from the in phase horizontal sync signal instead of the out of phase horizontal sync signal due to the vertical sync signal. The coast signal refers to the signal which enables the phase locked loop to generate the sampling clock signal using the previous in phase horizontal sync signal, instead of the horizontal sync signal that is out of phase.

An image processor using the coast signal in the PLL as described above is disadvantageous in that it necessitates an additional scaler that generates the coast signal from the composite sync signal. In addition, even though the scaler generates the coast signal in a stable manner, there is the possibility that an out of phase sampling clock signal may be generated.

In case of an image processor which uses the vertical sync signal instead of the coast signal, the out of phase sampling clock signal may be generated if the phase of the vertical sync signal is delayed, or there is an equalizing pulse or a serration pulse or a copy protection pulse in the vertical sync interval.

Incorporated by reference herein are the following references which describe control of a PLL to prevent erroneous phase comparison results due to the vertical sync signal: U.S. Pat. No. 4,253,116 to Robert L. Rogers, III, entitled Televison Synchronizing System Operable From Nonstandard Signals; U.S. Pat. No. 4,809,068 to Hiroshi Nagai entitled Clock Signal Generating Circuit For Television Receiver; U.S. Pat. No. 5,019,907 to Satoshi Murakoshi et al. entitled Pulse Generating Circuit; U.S. Pat. No. 5,663,688 to Christian Delmas, et al. entitled Method Of Enhancing The Noise Immunity OF A Phase-Locked Loop, And Device Implementing This Method; and U.S. Pat. No. 6,222,590 to Yuji Makino entitled Phase-Locked Loop Circuit.

SUMMARY OF THE INVENTION

To solve the above-described problems, it is an object of the present invention to provide a method for easily generating a coast signal, which is necessary to accurately generate a sampling clock signal from a composite sync signal, for image processing.

It is another object of the present invention to provide a coast signal generator for an image processor, which generates a coast signal.

To achieve the first object of the present invention, there is provided a method for generating a coast signal that is necessary to generate a sampling clock signal used to convert an analog image signal into a digital image signal, by using a composite sync signal that is inputted from an exterior and includes a vertical sync signal and a horizontal sync signal. The coast signal generation method includes enabling the coast signal in a first period from the time when the level of the vertical sync signal is changed to the time when the level of the vertical sync signal is changed again, and enabling the coast signal, in a second period other than the first period out of unit periods of the vertical sync signal, while a period of the horizontal sync signal is not a pre-determined value. A phase of the sampling clock signal, which is generated when the coast signal is enabled, is the same as that of the sampling clock signal, which is generated when the coast signal is disabled.

To achieve the second object of the present invention, there is provided a coast signal generating apparatus which performs the coast signal generation method. The coast signal generating apparatus is included in an image processing apparatus having an analog-to-digital converter (ADC) for converting the analog image signal into the digital image signal in response to the sampling clock signal and a phase-locked loop (PLL) for generating the sampling clock signal from the composite sync signal. The coast signal generating apparatus counts the first period and the second period in response to the vertical sync signal, enables the coast signal in the first period and the coast signal in the second period while a unit period of the horizontal sync signal is not the pre-determined value, and outputs the enabled coast signal to the phase locked loop. The phase locked loop generates the sampling clock signal from the composite sync signal in response to the disabled coast signal and outputs the generated sampling clock signal to the ADC, and outputs the sampling clock signal which is generated previously, to the ADC in response to the enabled coast signal.

BRIEF DESCRIPTION OF THE DRAWINGS

A more complete appreciation of the present invention, and many of the attendant advantages thereof, will become readily apparent as the same becomes better understood by reference to the following detailed description when considered in conjunction with the accompanying drawings in which like reference symbols indicate the same or similar components, wherein:

FIGS. 2(a) and 2(b) show waveforms of a vertical sync signal and a coast signal respectively;

DETAILED DESCRIPTION OF THE INVENTION

Hereinafter, a method and apparatus for generating a coast signal for an image processing according to the present invention will now be described with reference to the accompanying drawings.

Figure 1:
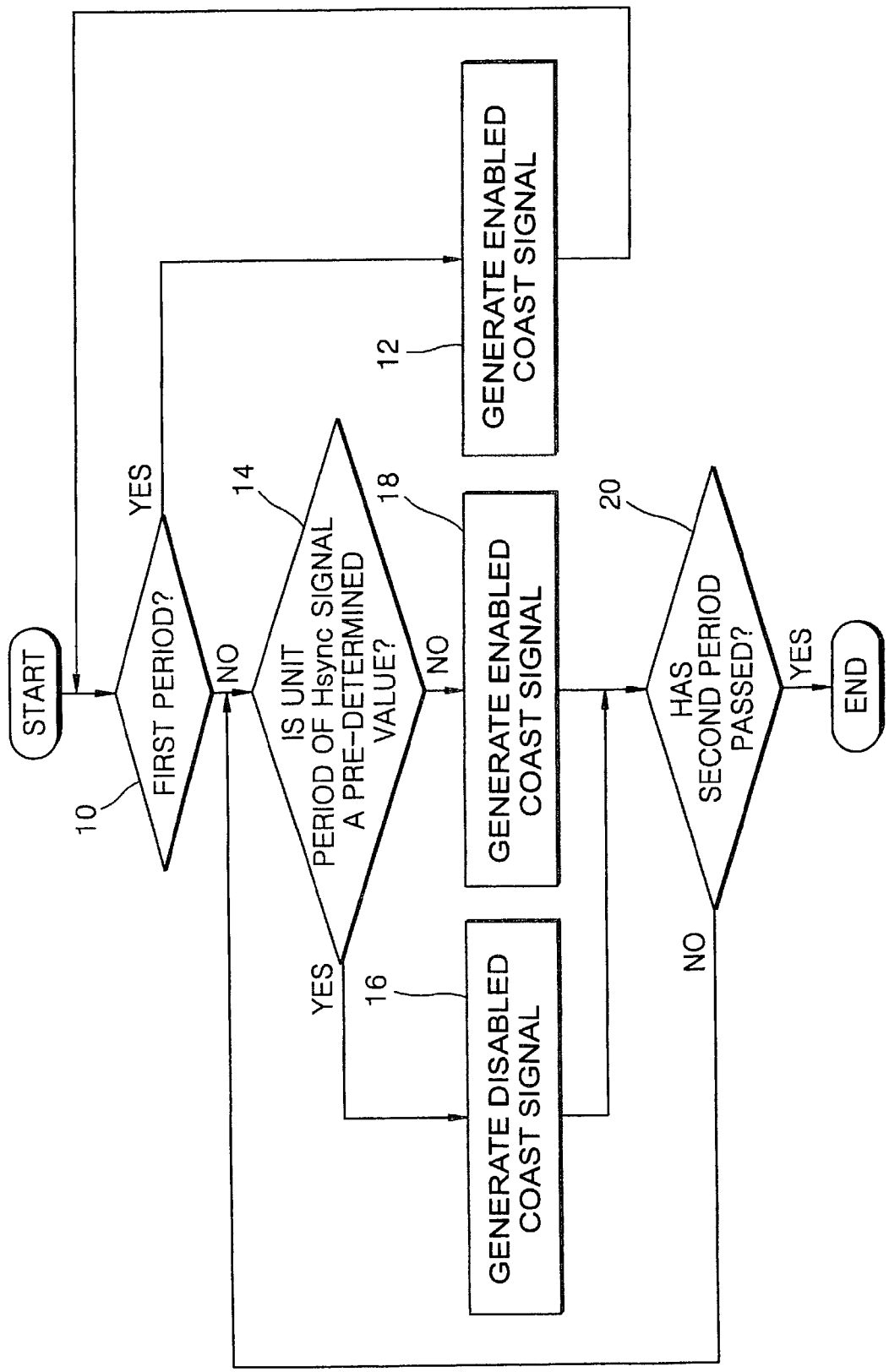
FIG. 1 is a flowchart describing a method for generating a coast signal for an image processing according to the present invention.

FIG. 1 is a flowchart describing a method for generating a coast signal for image processing according to the present invention. The method includes enabling a coast signal in a first period (steps 10 and 12); and enabling or disabling the coast signal depending on a calculated unit period of a horizontal sync signal in a second period (steps 14 through 20). The method will be described in more detail with respect to FIGS. 2(a)–4.

FIGS. 2(a) and 2(b) show waveforms of a vertical sync signal and a coast (COAST) signal, respectively.

A coast signal is necessary at certain times when utilizing a phase-locked loop to generate a sampling clock signal in response to a composite sync (Csync) signal inputted from an exterior. The sampling clock signal is then used to convert an analog image signal into a digital image signal. The composite sync signal includes a vertical sync signal and a horizontal sync signal. The composite sync signal can be extracted if R (Red), G (Green) and B (Blue) color signals are eliminated from the image signal inputted from the exterior in a monitor of a personal computer (PC), if a color difference signal is eliminated from a composite video baseband signal (CVBS) inputted from the exterior in a high definition television (HDTV) receiver or if color signals are eliminated from R and G color signals inputted from the exterior, and the G color signal (SOG: Sync On Green) including the sync signal. In addition, the composite sync signal can be extracted from the Sync On Y (SOY) including the sync signal and the color difference signals inputted from the exterior.

The first period referred to in step 10 refers to a vertical blanking interval when the method shown in FIG. 1 is performed by an image processor in a television receiver. When the method shown in FIG. 1 is performed by an image processor of a computer monitor, however, the first period refers to an injection start point of a vertical line.

Hereafter, with respect to FIGS. 1, 2(a) and 2(b), the method of generating a coast signal will refer to the case of utilizing an image processor in a television receiver. The first period 40 is judged in step 10. Here, in step 10, the first period 40 refers to the period between the moment 50 when the level of the vertical sync signal shown in FIG. 2(a) changes to the moment 52 when the level of the vertical sync signal changes again.

In the coast signal generation method according to the present invention, it is judged if the logic level of the vertical sync signal is changed between a high logic level and a low logic level, as shown in FIG. 2(a). If the first period 40 is judged, that is, if it is judged that the high logic level of the vertical sync signal is changed to the low logic level denoted by reference numeral 50 in FIG. 2(a), then in step 12 the coast signal is enabled as shown in FIG. 2(b). That is, the enabled coast signal (the coast signal having a high logic level as shown in FIG. 2(b)) is generated, and then the procedure returns to the step 10.

For easy understanding of the present invention, the coast signal of FIG. 2(b) having a high logic level is deemed to be enabled whereas the coast signal having a low logic level is deemed to be disabled. However, the present invention is not limited to the above. That is, unlike description of FIG. 2(b), the coast signal having the low logic level may be deemed to be enabled whereas the coast signal having the high logic level may be deemed to be disabled. In FIG. 2(b) it is apparent that the enabled coast signal was being generated at the time moment 50 was determined, and thus upon detection of the first period in step 10, the enabled coast signal continued to be generated.

Following step 12, the first period 40 is again judged in step 10. That is, it is judged whether the level of the vertical sync is changed from the low logic to the high logic level at moment 52. If it is judged that the level of the vertical sync signal is not changed from the low logic to the high logic (that is, the level of the vertical sync signal is still in the first period 40), the enabled coast signal having the high logic level is generated continuously in step 12. Therefore, the coast signal which is enabled to have the high logic level during the first period 40 can be generated by performing the steps 10 and 12.

However, if it is judged in step 10 that the level of the vertical sync signal is not in the first period (that is, the level of the vertical sync signal is in a second period other than the first period out of the unit periods of the vertical sync signal), the enabled coast signal is generated in the second period while the unit period of the horizontal sync signal is not a pre-determined value (steps 14 through 20).

For example, if the unit period of the horizontal sync signal is not a pre-determined value during the second period 42 of the vertical sync signal shown in FIG. 2(a), the enabled coast signal (the coast signal having a high logic level as shown in FIG. 2(b)) is generated.

If the unit period of the horizontal sync signal is a pre-determined value, the disabled coast (the coast signal having a low logic level as shown in FIG. 2(b)) is generated. According to the present invention, if the signal is an equalizing pulse or a copy protection pulse, it is judged that the unit period of the horizontal sync signal is not a pre-determined value.

The period (0.5H) of the equalizing pulse interval is half the horizontal period (H). The copy protection pulse is intentionally inserted in order to prevent a user who is not allowed to copy an image signal from copying the image signal, and means the horizontal sync signal the unit period of which is 8H~9H. That is, that the unit period of the horizontal sync signal is a pre-determined value means the unit period of the horizontal sync signal is H. On the contrary, that the unit period of the horizontal sync signal is not a predetermined value means the period of the horizontal sync signal is 0.5H or 8H~9H in the second period 42 shown in FIG. 2(*a*).

That is, the coast signal is generated according to the present invention in the following way. If not the first period but the second period is judged in step 10, it is judged whether the unit period of the horizontal sync signal is a pre-determined value (H) in step 14. If it is judged that the unit period of the horizontal sync signal is a pre-determined value, the disabled coast signal (coast signal having a low logic level as shown in FIG. 2(*b*)) is generated in step 16. However, if it is judged that the unit period of the horizontal sync signal is not a pre-determined value, the enabled coast signal is generated in step 18.

After performing the step 16 or 18, it is judged whether the second period passes in step 20. If it is judged that the second period has not passed, the step 14 is performed. However, if it is judged that the second period has passed, the coast signal generation method according to the present invention is completed.

For detailed explanation of steps 14 through 20 with reference to FIGS. 2(*a*) and 2(*b*), it is judged, in step 14, whether the unit period of the horizontal sync signal is a pre-determined value in the second period 42 after the level of the vertical sync signal is changed from the low logic level to the high logic level at moment 52. For example, in step 14, it is judged whether there exists an equalizing pulse (not shown) in section 44. If it is judged that the equalizing pulse exists in the section 44, the enabled coast signal is generated, in step 18, and the procedure goes to the step 20. Therefore, if the steps 14, 18 and 20 are performed repeatedly, the enabled coast signal having a high logic level as shown in FIG. 2(*b*) can be generated in the section 44 where the equalizing pulse exists. In addition, if the section 44 shown in FIG. 2(*a*) passes and there is not an equalizing pulse any longer, the coast signal having the high logic level is disabled to have the low logic level as shown in FIG. 2(*b*), thus the disabled coast signal is generated.

However, if it is judged that there is no equalizing pulse, the disabled coast signal is generated, in step 16, and the procedure goes to the step 20. For example, if there is no equalizing pulse in the section 44 shown in FIG. 2(*a*), the coast signal having the high logic level is disabled to have a low logic level at the moment 52 where the level of the vertical sync signal shown in FIG. 2(*a*) is changed from the low logic level to the high logic level, as shown by the dotted line in FIG. 2(*b*).

After step 16, it is judged if the second period 42 has passed in step 20. If it is judged that the second period 42 has not passed, it is judged whether the unit period of the horizontal sync signal is a pre-determined value again in step 14. For example, in step 14, it can be judged whether the copy protection pulse exists in the section 46. If it is judged that the copy protection pulse does not exist in the section 46 (that is, if it is judged that the unit period of the horizontal sync signal is a pre-determined value (H)), generation of the disabled coast signal having a low logic level is maintained in step 16, and the procedure goes to step 20. However, if it is judged that the copy protection pulse exists (that is, if it is judged that the unit period of the horizontal sync signal is not a pre-determined value (H)), the enabled coast signal having the high logic level, not as shown in FIG. 2(*b*), is generated in step 18, and the procedure goes to step 20. Therefore, if the steps 14, 18 and 20 are performed, the enabled coast signal can be generated in the section 46 when the copy protection pulse exists.

After the step 16 or 18, it is judged whether the second period 42 has passed in step 20. If it is judged that the second period 42 has not passed, it is judged whether the unit period of the horizontal sync signal is a pre-determined value again in step 14. For example, in the step 14, it is judged if an equalizing pulse exists in the section 48. The sections 44 and 48 where equalizing pulses exist will be described below.

Figure 3A:
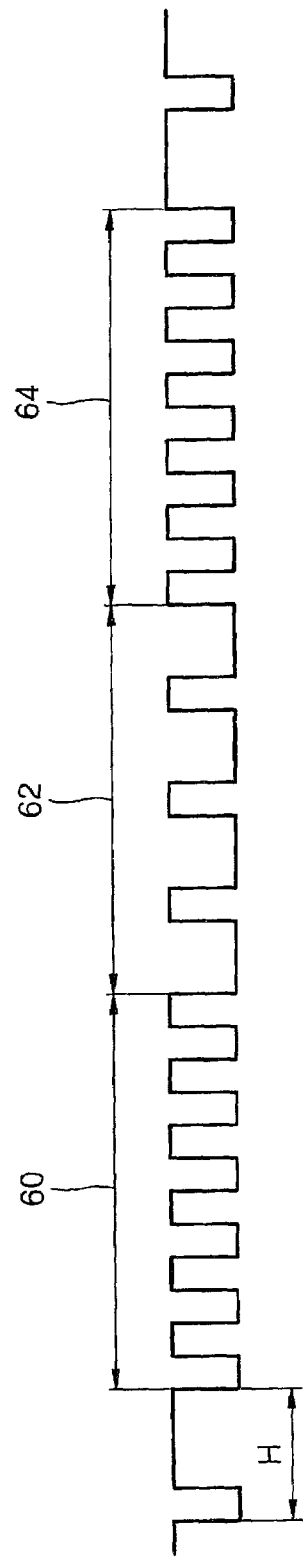
FIGS. 3(a) and 3(b) are waveforms a composite sync signal and vertical blanking interval.
Figure 3B:
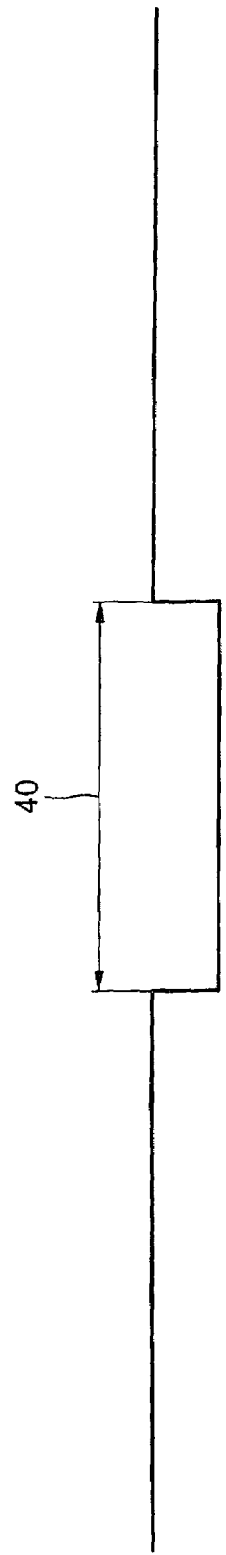

FIGS. 3(*a*) and 3(*b*) are waveform diagrams explaining the sections 40, 44 and 48 shown in FIG. 2(*a*). FIG. 3(*a*) is a waveform diagram of the composite sync signal having the shapes of equalizing pulses in the equalizing pulse intervals 60 and 64 which have the period of 0.5H and serration pulses in the vertical pulse interval 62 of the first period 40. FIG. 3(*b*) is a waveform diagram of the vertical sync signal.

If it is judged that there is an equalizing pulse in the section 48 of FIG. 2(*a*), the enabled coast signal is generated in step 18, as shown in FIG. 2(*b*), and the process progresses to the step 20.

If the steps 14, 18 and 20 are performed, the enabled coast signal can be generated in the section 48 where the equalizing pulse exists. However, if it is judged that there is no equalizing pulse in the section 48, the disabled coast signal is generated in step 16, and the procedure goes to the step 20. It is judged whether the second period 42 has passed in step 20. If it is judged that the second period 42 has not passed, the procedure goes to the step 14. However, if it is judged that the second period 42 has passed, the coast signal generation method according to the present invention is completed.

As for the coast signal generation method according to the present invention, the enabled coast signal is generated in the first period (vertical pulse interval) 40 and the sections where equalizing pulses (equalizing pulse interval) and the copy protection pulse exist, and the disabled coast signal is generated in the other sections.

Each of the sections 40, 44 and 48 shown in FIG. 2(*a*) may be 3H. The phase of the sampling clock signal, which is generated when the enabled coast signal shown in FIG. 2(*b*) is generated to have the high logic level, is the same as that of the sampling clock signal, which is generated when the disabled coast signal shown in FIG. 2(*b*) is generated to have the low logic level. Therefore, according to the present invention, use of the enabled coast signal can prevent the sampling clock signals from being out of phase due to pulses in the vertical sync interval.

The configuration and the operation of the coast signal generator according to the present invention performing the method, which generates the coast signal for the image processing as shown in FIG. 1, will now be described in greater detail by describing preferred embodiments thereof with further reference to FIGS. 4 and 5.

Figure 4:
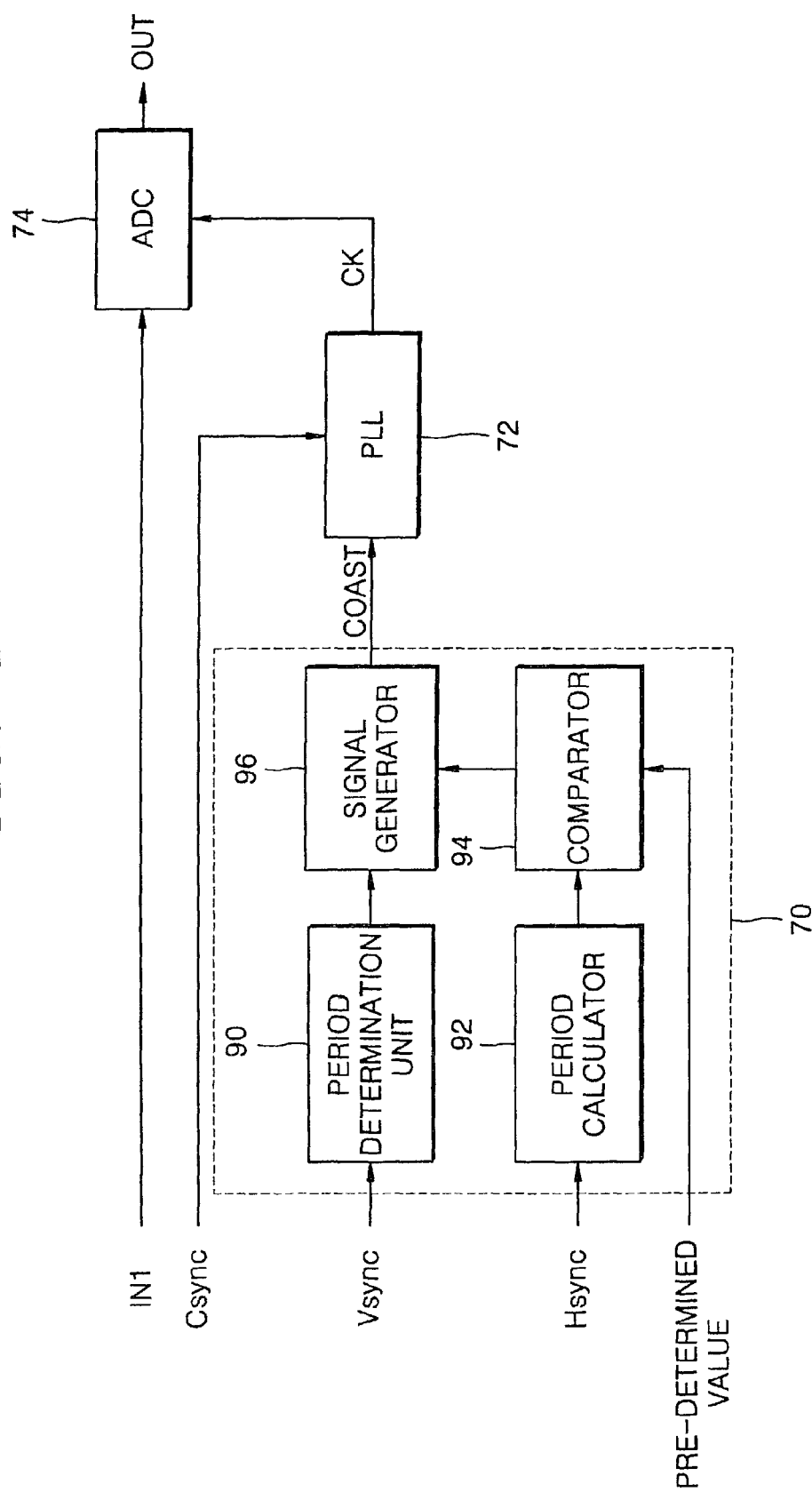
FIG. 4 is a block diagram of an image processing apparatus including a coast signal generating apparatus according to the present invention.

FIG. 4 is a block diagram of an image processing apparatus including the coast signal generating apparatus according to the present invention, which performs the method shown in FIG. 1. The image processing apparatus includes a coast signal generating apparatus 70, a phase-locked loop (PLL) 72 and an analog-to-digital converter(ADC) 74. The image processing apparatus shown in FIG. 4 may be built in a monitor of a personal computer (PC), a television receiver or other image display device.

The ADC 74 shown in FIG. 4 converts an analog image signal inputted through an input terminal IN1 into a digital image signal in response to a sampling clock signal (CK) inputted from the phase locked loop 72, and outputs the converted digital image signal to, for example, a scaler (not shown) through an output terminal OUT. The phase-locked loop 72 generates the sampling clock signal (CK) from the composite sync signal (Csync) including the horizontal sync signal and the vertical sync signal, and outputs the generated sampling clock signal (CK) to the ADC 74. The configuration and the operation of the phase locked loop 72 will be described in detail below.

The coast signal generating apparatus 70 shown in FIG. 4 counts the first period 40 and the second period 42 in response to the vertical sync signal, enables the coast signal in the first period and outputs the enabled coast signal to the phase locked loop 72. In addition, the coast signal generating apparatus 70 enables the coast signal in the second period while the unit period of the horizontal sync signal is not a pre-determined value, and outputs the enabled coast signal to the phase locked loop 72.

According to a preferred embodiment of the present invention, the coast signal generating apparatus 70 includes a period determination unit 90, a period calculator 92, a comparator 94 and a signal generator 96 as shown in FIG. 4.

The period determination unit 90 counts the first period 40 and the second period 42 in response to the vertical sync signal (Vsync), and outputs the counted result to the signal generator 96. To do so, the period determination unit 90 can be implemented as a counter (not shown) that up-counts or down-counts the system clock signal in response to the vertical sync signal and outputs the counted result to the signal generator 96. For example, the counter as the period determination unit 90 up-counts the system clock signal at the falling edge 50 of the vertical sync signal and down-counts the system clock signal at the rising edge 52, and outputs the counted result to the signal generator 96. The system clock signal is a master clock signal of the image processing apparatus of FIG. 4.

The period calculator 92 calculates the unit period of the horizontal sync signal (Hsync) and outputs the calculated unit period to the comparator 94. To do so, the period calculator 92 can be implemented as a counter (not shown) that counts the unit period of the horizontal sync signal and outputs the counted unit period to the comparator 94. The counter as the period calculator 92 starts to count the system clock signal at the rising (or falling) edge of the horizontal sync signal and completes counting of the system clock signal at the next rising (or falling) edge of the horizontal sync signal, and can output the counted result as the unit period of the horizontal sync signal.

The vertical sync signal inputted to the period determination unit 90 and the horizontal sync signal inputted to the period calculator 92 can be outputted from a sync signal divider (not shown). The sync signal divider separates the vertical sync signal and the horizontal sync signal from the composite sync signal and outputs them to the period determination unit 90 and the period calculator 92 respectively.

The comparator 94 compares the unit period calculated by the period calculator 92 with a pre-determined value inputted from the exterior, and outputs the compared result to the signal generator 96. The pre-determined value can be calculated by the period calculator 92 rather than being inputted from the exterior. To do so, the period calculator 92 counts the period (H) when the horizontal sync signal is generated in a stable manner, and determines the counted result as the pre-determined value.

The signal generator 96 outputs the coast signal COAST, which is enabled or disabled in response to the counting result of the period determination unit 90 and the comparison result inputted from the comparator 94, to phase-locked loop 72.

For example, if the signal generator 96 identifies the first period 40 based on the counting result of the period determination unit 90, it enables the level of the coast signal COAST and outputs the coast signal COAST having the enabled level to the phase locked loop 72. For example, the signal generator 96 generates the enabled coast signal COAST until the up-counted result becomes the counting value corresponding to the first period 40 if the counting result of the counter implementing the period determination unit 90 is an up-counted result.

However, if the signal generator 96 identifies the second period 42 other than the first period 40 based on the counting result of the period determination unit 90, it enables or disables the coast signal COAST based on the comparison result of the comparator 94. For example, if the counting result of the counter implementing the period determination unit 90 is a down-counted value, the signal generator 96 generates the disabled or enabled coast signal COAST in response to the comparison result of the comparator 94 until the down-counted result becomes the counting value corresponding to the second period 42. That is, if the signal generator 96 identifies that the unit period of the horizontal sync signal is a pre-determined value based on the comparison result of the comparator 94, it generates the disabled coast signal. However, if the signal generator 96 identifies that the unit period of the horizontal sync signal is not a pre-determined value based on the comparison result of the comparator 94, it generates the enabled coast signal COAST.

According to another preferred embodiment of the present invention, the coast signal generating apparatus 70 can be implemented by a main controller (not shown) which controls all the operations of the image processing apparatus rather than being implemented by the period determination unit 90, the period calculator 92, the comparator 94 and the signal generator 96 shown in FIG. 4. In this case, a timer (not shown) built in the main controller determines whether the current period is the first period 40 or the second period 42 in steps 10 and 20 by counting the system clock signal at the falling edge 50 or the rising edge 52 of the vertical sync signal. In the first period 40, the timer performs the step 12, and performs the steps 14 through 20 in the second period 42. To perform steps 14 through 20, the main controller calculates the predetermined value (H), which is the unit period when the horizontal sync signal is generated in a stable manner, by means of counting operation in advance. Then, the main controller compares the pre-determined value which is calculated in advance with the unit period of the horizontal sync signal which is calculated currently by means of the counting operation, and performs the step 16 or 18 based on the comparison result. As a result, the main controller can identify whether the current period is the first period and the second period by means of the counting operation of the timer, and calculate the unit period of the horizontal sync signal and the predetermined value. In addition, the main controller can compare the pre-determined value and the unit period by means of the comparison operation performed in the main controller itself.

When the phase-locked loop 72 shown in FIG. 4 receives the disabled coast signal from the coast signal generator 70, it generates the sampling clock signal from the composite sync signal and outputs the generated clock signal to the ADC 74. However, if the phase-locked loop 72 receives the enabled coast signal from the coast signal generating apparatus 70, it outputs the sampling clock signal, which is previously generated, that is, which is previously outputted to the ADC 74, to the ADC 74 continuously.

Figure 5:
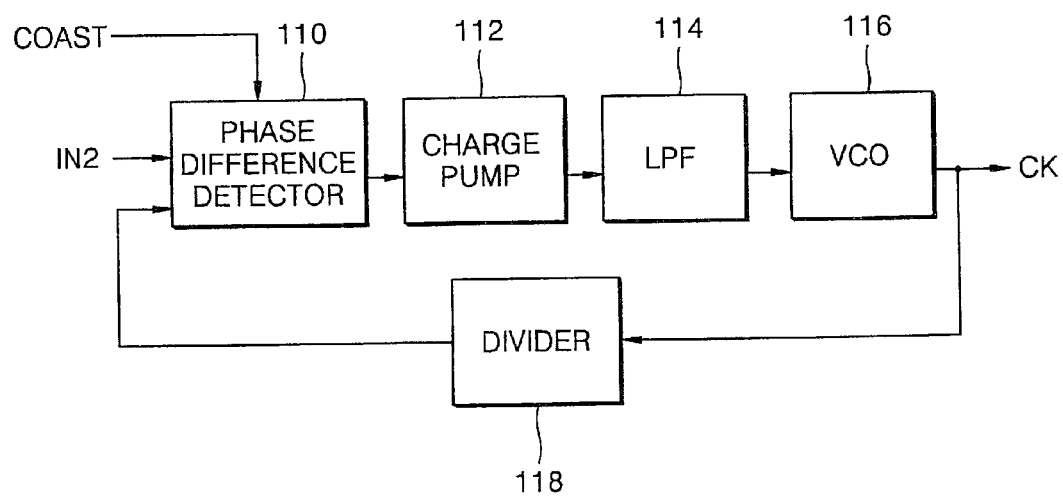
FIG. 5 is a block diagram of a phase locked loop shown in FIG. 4.

The configuration and the operation of one embodiment of the phase-locked loop 72 shown in FIG. 4 are described with respect to FIG. 5.

FIG. 5 is a block diagram of the phase-locked loop 72 shown in FIG. 4. The phase-locked loop includes a phase difference detector 110, a charge pump 112, a low pass filter (LPF) 114, a voltage controlled oscillator (VCO) 116 and a divider 118.

If the disabled coast signal COAST is inputted, the phase difference detector 110 detects the phase difference between composite sync signal inputted through the input terminal IN2 and the divided signal which is inputted from the divider 118, and outputs the detected phase difference to the charge pump 112. However, if the enabled coast signal COAST is inputted, the phase difference detector 110 outputs the previously detected phase difference to the charge pump 112, rather than detecting the phase difference between composite sync signal inputted through the input terminal IN2 and the divided signal which is inputted from the divider 118.

The charge pump 112 sources or sinks the electric charge according to the phase difference detected by the phase difference detector 112. The LPF 114 low-pass-filters the voltage corresponding to the sourced or sunken electric charge, and outputs the low-pass-filtered direct current (DC) voltage to the VCO 116. The VCO 116 outputs the oscillation signal as the sampling clock signal CK, which has the frequency oscillated in response to the DC voltage inputted from the LPF 114, to the ADC 74 and also to the divider 118. The divider 118 receives the sampling clock signal inputted from the VCO 116 and divides it by several integer times, and outputs the divided result to the phase difference detector 110.

As described above, the apparatus and the method of the present invention for generating the coast signal for the image processing generate the accurate coast signal to prevent the sampling clock signals from being out of phase even though the vertical sync signal is delayed, the horizontal sync signal is generated in the form of either the equalizing pulse or the serration pulse or in the form of both the equalizing pulse and the serration pulse, or the length of the first period 40 varies depending on the resolution. Then, the present invention can prevent the upper part of the display screen from being bent and generate the coast signal easily by means of the counting operation and the comparison operation. In addition, when a main controller generates the coast signal, additional hardware for generating the coast signal is not required. Therefore, the cost for manufacturing the image processing apparatus can be reduced.

What is claimed is:

1. A method for generating a coast signal for controlling phase comparison in a phase-locked loop that generates a sampling clock signal used to convert an analog image signal into a digital image signal, the coast signal generation method comprising steps of:
    detecting a first period in a vertical sync signal and generating an enabled coast signal in response to the detected first period;
    determining in a second period, different from the first period, whether an interval between detected pulses is equal to a predetermined interval;
    generating a disable coast signal during said second period when said interval between detected pulses is equal to said predetermined interval; and
    generating the enable coast signal during said second period when said interval between detected pulses is not equal to said predetermined interval.

2. The method of claim 1, wherein the first period corresponds to a vertical blanking interval.

3. The method of claim 1, wherein the first period is an injection start point of a vertical line in a computer monitor.

4. The method of claim 1, wherein said predetermined interval is a horizontal sync interval.

5. The method of claim 1, wherein said step of detecting a first period in a vertical sync signal comprises detecting when said vertical sync signal changes from a first logic level to a second logic level.

6. The method of claim 1, further comprising a step of returning to said detecting step after generating said enabled coast signal during said first period.

7. The method of claim 1, further comprising steps of:
    detecting whether said second period has elapsed; and
    returning to said step of determining in the second period whether the interval between the detected pulses is equal to said predetermined interval when said second period has not elapsed.

8. The method of claim 2, further comprising steps of:
    detecting whether said second period has elapsed; and
    returning to said step of determining in the second period whether the interval between the detected pulses is equal to said predetermined interval when said second period has not elapsed.

9. The method of claim 6, further comprising steps of:
    detecting whether said second period has elapsed; and
    returning to said step of determining in the second period whether the interval between the detected pulses is equal to said predetermined interval when said second period has not elapsed.

10. The method of claim 9, wherein the first period corresponds to a vertical blanking interval.

11. An apparatus for generating a coast signal for controlling phase comparison in a phase-locked loop that generates a sampling clock signal used to convert an analog image signal into a digital image signal, the coast signal generating apparatus comprising:
    period determination means for detecting a first period in a vertical sync signal;
    signal generating means for generating an enabled coast signal when said period determination means detects said first period;
    period calculation means for determining in a second period, different from the first period, an interval between received pulses;
    means for determining whether the determined interval is equal to a predetermined interval;
    said signal generating means generating a disable coast signal during said second period when said determined interval is equal to said predetermined interval; and
    said signal generating means generating the enable coast signal during said second period when said determined interval is not equal to said predetermined interval.

12. The coast signal generating apparatus as set forth in claim 11, wherein the first period corresponds to a vertical blanking interval.

13. The coast signal generating apparatus as set forth in claim 11, said period determination means comprising a counter for receiving a vertical sync signal separated from a composite sync signal and counting the first period when said vertical sync signal changes from a first logic level to a second logic level and for counting the second period when said vertical sync signal changes from the second logic level to the first logic level.

14. The coast signal generating apparatus as set forth in claim 11, said period calculation means comprising a counter for receiving a horizontal sync signal separated from a composite sync signal and counting a period between each detected pulse and outputting the counted result as the determined interval.

15. The coast signal generating apparatus as set forth in claim 13, said period calculation means comprising a counter for receiving a horizontal sync signal separated from a composite sync signal and counting a period between each detected pulse and outputting the counted result as the determined interval.

16. The coast signal generating apparatus as set forth in claim 11, said means for determining whether the determined interval is equal to the predetermined interval comprising a comparator and said predetermined interval corresponds to a horizontal sync interval.

17. The coast signal generating apparatus as set forth in claim 11, said phase-locked loop comprising:
   a phase difference detector outputting a detected phase difference signal by detecting a difference in phase between pulses of a received composite sync signal and a reference signal when said disabled coast signal is applied to said phase difference detector;
   said phase difference detector being inhibited from detecting the difference in phase between pulses of the received composite sync signal and the reference signal when said enabled coast signal is applied to said phase difference detector, and outputting a previously detected phase difference signal output when said disabled coast signal was applied to said phase difference detector;
   a voltage controlled oscillator generating said sampling clock signal in response to the detected phase difference signal output from said phase difference detector; and
   a divider for generating said reference signal by dividing said sampling clock signal by a predetermined value.

* * * * *